(12) United States Patent
Suzuki et al.

(10) Patent No.: US 11,948,860 B2
(45) Date of Patent: Apr. 2, 2024

(54) HEAT SINK

(71) Applicant: WELCON Inc., Niigata (JP)

(72) Inventors: Yutaka Suzuki, Niigata (JP); Takashi Saito, Niigata (JP); Shingo Ikarashi, Niigata (JP)

(73) Assignee: WELCON Inc., Niigata (JP)

( * ) Notice: Subject to any disclaimer, the term of this patent is extended or adjusted under 35 U.S.C. 154(b) by 658 days.

(21) Appl. No.: 16/642,747

(22) PCT Filed: Aug. 29, 2017

(86) PCT No.: PCT/JP2017/031029
§ 371 (c)(1),
(2) Date: Feb. 27, 2020

(87) PCT Pub. No.: WO2019/043801
PCT Pub. Date: Mar. 7, 2019

(65) Prior Publication Data
US 2020/0258815 A1    Aug. 13, 2020

(51) Int. Cl.
*H01L 23/473* (2006.01)
*F28F 3/12* (2006.01)
*F28F 13/06* (2006.01)

(52) U.S. Cl.
CPC ............ *H01L 23/4735* (2013.01); *F28F 3/12* (2013.01); *F28F 13/06* (2013.01)

(58) Field of Classification Search
CPC ...... H01L 23/473; H01L 23/4735; F28F 3/12; F28F 13/06; H05K 7/20; H05K 7/20254
(Continued)

(56) References Cited

U.S. PATENT DOCUMENTS

| 3,361,195 A | 1/1968 | Meyerhoff et al. |
| 4,494,171 A | 1/1985 | Bland et al. |

(Continued)

FOREIGN PATENT DOCUMENTS

| CN | 105209845 A | 12/2015 |
| GB | 2 500 703 A | 10/2013 |

(Continued)

OTHER PUBLICATIONS

International Search Report dated Nov. 7, 2017 in PCT/JP2017/031029 filed Aug. 29, 2017, 2 pages.
(Continued)

*Primary Examiner* — Len Tran
*Assistant Examiner* — Gustavo A Hincapie Serna
(74) *Attorney, Agent, or Firm* — Oblon, McClelland, Maier & Neustadt, L.L.P.

(57) ABSTRACT

A multilayer heat sink including a heat-receiving layer, a channel layer including cooling micropaths extending and directing a fluid in a direction orthogonal to a stacking direction, an orifice layer including jet orifices configured to jet the fluid into the cooling micropaths, and drain orifices configured to drain the fluid from the cooling micropaths, a header layer including a peripheral wall and a baffle, and a bottom layer, wherein the baffle includes parallel plates disposed parallel to each other, and end plates configured to alternately close an opening at an end and an opening at an opposite end of the parallel plates, and the orifice layer, the bottom layer, the baffle, and the peripheral wall define a supply channel to guide the fluid from a fluid inlet to the jet orifices and a drain channel to guide the fluid from the drain orifices to a fluid outlet.

17 Claims, 15 Drawing Sheets

(58) Field of Classification Search
USPC ....... 257/714; 165/80.2, 80.4; 361/696, 699, 361/709
See application file for complete search history.

(56) References Cited

U.S. PATENT DOCUMENTS

| | | | |
|---|---|---|---|
| 5,269,372 A | | 12/1993 | Chu et al. |
| 5,647,202 A * | | 7/1997 | Althaus .................. F23R 3/002 431/352 |
| 6,000,908 A * | | 12/1999 | Bunker .................. F01D 5/189 415/176 |
| 6,141,219 A * | | 10/2000 | Downing .............. H01L 23/473 361/689 |
| 7,075,959 B1 * | | 7/2006 | Downing ................ H01S 3/042 372/34 |
| 7,188,662 B2 * | | 3/2007 | Brewer ................. H01L 23/473 257/E23.098 |
| 7,339,788 B2 * | | 3/2008 | Olesen .................. F28F 9/0268 257/E23.098 |
| 7,836,597 B2 * | | 11/2010 | Datta .................. H01L 21/4882 29/890.032 |
| 8,047,273 B2 * | | 11/2011 | Schubert ............... H01L 23/473 165/80.4 |
| 8,169,779 B2 * | | 5/2012 | Le ....................... H01L 23/4735 361/689 |
| 8,413,712 B2 | | 4/2013 | Brunschwiler et al. |
| 8,427,832 B2 * | | 4/2013 | Dede .................... F28F 9/0221 361/717 |
| 8,464,781 B2 * | | 6/2013 | Kenny .................. F28F 13/06 165/80.4 |
| 9,061,382 B2 * | | 6/2015 | Campbell .......... H05K 7/20254 |
| 10,096,537 B1 * | | 10/2018 | Chen .................. F28D 15/0266 |
| 10,443,957 B2 * | | 10/2019 | Kikuchi ............. H05K 7/20254 |
| 10,533,809 B1 * | | 1/2020 | Sherrer ............... H01L 23/4735 |
| 10,655,922 B2 * | | 5/2020 | Bungo ............... H05K 7/20927 |
| 10,837,718 B2 * | | 11/2020 | Bungo .................... F28F 3/048 |
| 2004/0008487 A1 | | 1/2004 | Hisano et al. |
| 2006/0096738 A1 * | | 5/2006 | Kang ...................... F28F 3/022 257/E23.098 |
| 2006/0266497 A1 * | | 11/2006 | Berger ................ H01L 23/4735 165/80.4 |
| 2007/0119565 A1 * | | 5/2007 | Brunschwiler ..... H01L 23/4735 165/80.2 |
| 2010/0032147 A1 * | | 2/2010 | Valenzuela ................ F28F 3/12 165/157 |
| 2011/0042041 A1 * | | 2/2011 | Zrodnikov .............. F28C 3/005 165/104.19 |
| 2011/0226448 A1 * | | 9/2011 | Valenzuela ............... F28F 3/12 165/173 |
| 2012/0325447 A1 * | | 12/2012 | You ................... H01M 10/6556 165/170 |
| 2013/0255750 A1 * | | 10/2013 | Escher ...................... F28F 3/12 136/246 |
| 2015/0221579 A1 | | 8/2015 | Iwata et al. |
| 2016/0183409 A1 * | | 6/2016 | Zhou .................. H01L 23/4735 165/104.31 |
| 2016/0366793 A1 * | | 12/2016 | Kikuchi ................ F28F 9/0204 |
| 2016/0379914 A1 * | | 12/2016 | Arai ........................ H01L 25/07 257/714 |
| 2018/0090417 A1 * | | 3/2018 | Gutala ................ H01L 23/3675 |
| 2018/0098458 A1 * | | 4/2018 | Chainer ............. H05K 7/20254 |
| 2020/0011620 A1 * | | 1/2020 | Sherrer ............... H01L 23/4735 |
| 2020/0029463 A1 * | | 1/2020 | Han ....................... F28F 13/06 |
| 2020/0296858 A1 * | | 9/2020 | Matsumura ........... H01L 23/473 |

FOREIGN PATENT DOCUMENTS

| | | |
|---|---|---|
| JP | 59-57499 A | 4/1984 |
| JP | 2004-47809 A | 2/2004 |
| JP | 2004-270970 A | 9/2004 |
| JP | 2007-142390 A | 6/2007 |
| JP | 2014-96527 A | 5/2014 |
| WO | WO 2014/014054 A1 | 1/2014 |

OTHER PUBLICATIONS

Extended European Search Report dated Mar. 11, 2021 in European Patent Application No. 17923311.9, 10 pages.
Office Action dated Dec. 16, 2022, in Chinese Patent Application No. 2017-80094306X filed Aug. 29, 2017, 8 pages.

* cited by examiner

HEAT SINK

FIELD

The present invention relates to a multilayer heat sink that cools an object in contact with the heat sink by flowing a fluid from a fluid inlet to a fluid outlet.

BACKGROUND

As electric devices (including electronic devices) such as a central processing unit (CPU) and semiconductor chips increase performance, they produce more and more heat. Cooling such devices is becoming an important issue that has to be tackled. Examples of methods for cooling the electric devices include air-cooling heat sinks and liquid-cooling heat sinks. In particular, liquid-cooling heat sinks are suitable for this purpose since they flow a coolant such as water having high thermal conductivity and can efficiently cool the electric devices.

To uniformly cool a cooling surface of an electric device, for example, a coolant has to be jetted to the cooling surface from many positions. This configuration is achieved by suitably forming three-dimensional coolant channels in the heat sink. To form such three-dimensional coolant channels, the heat sink may have a multilayer structure made of a plurality of plates having grooves that correspond to the channels (see, for example, Patent Literature 1).

CITATION LIST

Patent Literature

Patent Literature 1: Japanese Patent Application Laid-open No. 2014-096527

SUMMARY

Technical Problem

A wide variety of liquid-cooling heat sinks have been developed and they have been successful to some extent. However, recently developed electric devices produce more and more heat and thus heat sinks having higher cooling capacity are desired.

The present invention has been made in view of the foregoing, and it is an object of the present invention to provide a heat sink having a higher cooling capacity.

Solution to Problem

To solve the problem and achieve the object, a multilayer heat sink that cools an object in contact with the heat sink by flowing a fluid from a fluid inlet to a fluid outlet according to the present invention includes: a heat-receiving layer having a top surface in contact with the object to receive heat; a channel layer provided on a bottom surface of the heat-receiving layer, the channel layer including cooling micropaths extending and directing the fluid in a direction orthogonal to a stacking direction; an orifice layer provided on a bottom surface of the channel layer, the orifice layer including: jet orifices configured to jet the fluid into the cooling micropaths from the bottom surface; and drain orifices configured to drain the fluid from the cooling micropaths toward the bottom surface; a header layer provided on a bottom surface of the orifice layer, the header layer including: a peripheral wall; and a baffle provided in a region surrounded by the peripheral wall, the baffle being configured to separate the fluid inlet from the fluid outlet; and a bottom layer provided on a bottom surface of the header layer, wherein the baffle includes: parallel plates disposed parallel to each other; and end plates configured to alternately close an opening at an end and an opening at an opposite end of the parallel plates, and the orifice layer, the bottom layer, the baffle, and the peripheral wall define a supply channel to guide the fluid from the fluid inlet to the jet orifices and a drain channel to guide the fluid from the drain orifices to the fluid outlet.

This multilayer structure directs the fluid to be jetted from the jet orifices into the cooling micropaths extending in the direction orthogonal to the stacking direction to remove heat from the heat-receiving layer, thereby achieving a higher cooling capacity. In addition, the parallel plates disposed parallel to each other form a waveform having a deep depth with the end plates alternately closing an opening at an end and an opening at the opposite end of the parallel plates. This waveform can suitably distribute the incoming fluid and can suitably drain the fluid after removing heat, thereby further increasing the cooling capacity.

Moreover, in the heat sink according to the present invention, the supply channel includes: supply sub-channels flanked by the parallel plates; and an entrance channel connecting the fluid inlet with openings of the supply sub-channels, the drain channel includes: drain sub-channels flanked by the parallel plates; and an exit channel connecting the fluid outlet with openings of the drain sub-channels, and the entrance channel and the exit channel are provided at opposite positions.

Disposing the entrance channel and the exit channel at the opposite positions can prevent thermal interference between the channels, thereby increasing the cooling capacity. In addition, the supply sub-channels and the drain sub-channels can uniformly distribute the supply fluid and the drain fluid in the large area of the heat sink, and thus can achieve a higher cooling capacity.

Moreover, in the heat sink according to the present invention, the jet orifices are provided at positions overlapping the supply sub-channels when seen in the stacking direction, and are arranged in two lines for each supply sub-channel in an extension direction of the supply sub-channel, the drain orifices are provided at positions overlapping the drain sub-channels when seen in the stacking direction, and are arranged in two lines for each drain sub-channel in an extension direction of the drain sub-channel, and the cooling micropaths are configured to overlap the supply sub-channels and the drain sub-channels over the parallel plates when seen in the stacking direction to connect the jet orifices with the drain orifices.

With this configuration, the cooling micropaths are arranged in a matrix of rows and columns and can uniformly cool the entire surface. Each supply sub-channel supplies fluid to the neighboring drain sub-channels through the jet orifices arranged in two lines, and each drain sub-channel receives the fluid from the neighboring supply sub-channels through the drain orifices arranged in two lines. This configuration provides efficient and balanced cooling.

Moreover, in the heat sink according to the present invention, each of the cooling micropaths is configured to connect neighboring one jet orifice with one drain orifice.

Moreover, in the heat sink according to the present invention, the cooling micropaths have a non-linear shape having one or more bent portions when seen in the stacking direction.

Moreover, in the heat sink according to the present invention, the cooling micropaths include: upstream cooling paths configured to connect with the jet orifices, downstream cooling paths configured to connect with the drain orifices, and junctions at which each of the upstream cooling bifurcates into two branches and at which the adjacent branches join together to connect with the respective downstream cooling paths.

Moreover, in the heat sink according to the present invention, the cooling micropaths have a different shape and/or length depending on locations. Providing different types of cooling micropaths can adjust the cooling effect to more uniformly cool the heat-receiving surface, or can distribute the cooling area in accordance with the thermal distribution of the object.

Moreover, in the heat sink according to the present invention, the cooling micropaths include a narrow portion having a smaller width depending on the locations.

When the parallel plates and the end plates have at least partial multilayer structure with an insulator interposed in the thickness direction, the thermal interference between the supply channel and the drain channel can be further reduced.

Moreover, in the heat sink according to the present invention, the heat-receiving layer, the channel layer, the orifice layer, the header layer, and the bottom layer are made of plate members bonded by diffusion bonding. Diffusion bonding can form many minute microchannels having high strength. Such microchannels allow for a higher supply pressure and have a large channel surface area per unit volume, thereby achieving a higher cooling capacity.

Moreover, in the heat sink according to the present invention, the jet orifices and the drain orifices are through-holes provided in a plate member that forms the orifice layer. Such a through-hole structure facilitates the manufacturing process of the channels in the heat sink.

Moreover, in the heat sink according to the present invention, the jet orifices and/or the drain orifices have a different diameter depending on locations. Providing such orifices can adjust the cooling effect to more uniformly cool the heat-receiving surface, or can distribute the cooling area in accordance with the thermal distribution of the object.

Moreover, in the heat sink according to the present invention, the orifice layer is made of a plurality of plate members bonded by diffusion bonding, and the jet orifices and/or the drain orifices have a different diameter depending on the plate members. Combining such plates provides a greater adjustment range of the diameter of the jet orifices and the drain orifices.

Moreover, in the heat sink according to the present invention, the channel layer includes a plurality of channel layers between which an intermediate layer is interposed, and the intermediate layer includes: intermediate jet orifices disposed at positions overlapping the jet orifices when seen in the stacking direction; and intermediate drain orifices disposed at positions overlapping the drain orifices when seen in the stacking direction. Moreover, the intermediate jet orifices and the intermediate drain orifices connect the cooling micropaths at a top layer with the cooling micropaths at a bottom layer.

This configuration allows the fluid to remove the heat from the heat-receiving surface not only at the top layer but also at the deeper layers, and provides a larger channel surface area than a single-channel structure, thereby increasing the cooling capacity. Although the heat sink described above is configured to cool an object, it can also heat the object by flowing an adequately hot fluid.

Advantageous Effects of Invention

The heat sink according to the present invention has a multilayer structure that directs a fluid to be jetted from the jet orifices into the cooling micropaths extending in a direction orthogonal to the stacking direction to remove heat from the heat-receiving layer. This structure can increase the cooling capacity of the heat sink. In addition, the parallel plates disposed parallel to each other form a waveform having a deep depth with the end plates alternately closing an opening at an end and an opening at the opposite end of the parallel plates. This waveform can suitably distribute the incoming fluid and can suitably drain the fluid after removing heat, thereby further increasing the cooling capacity. The heat sink has low thermal resistance and thus can heat an object by flowing an adequately hot fluid.

DESCRIPTION OF EMBODIMENT

The following describes a heat sink according to an embodiment of the present invention with reference to the accompanying drawings. The embodiment is not intended to limit the scope of the present invention.

Figure 1:
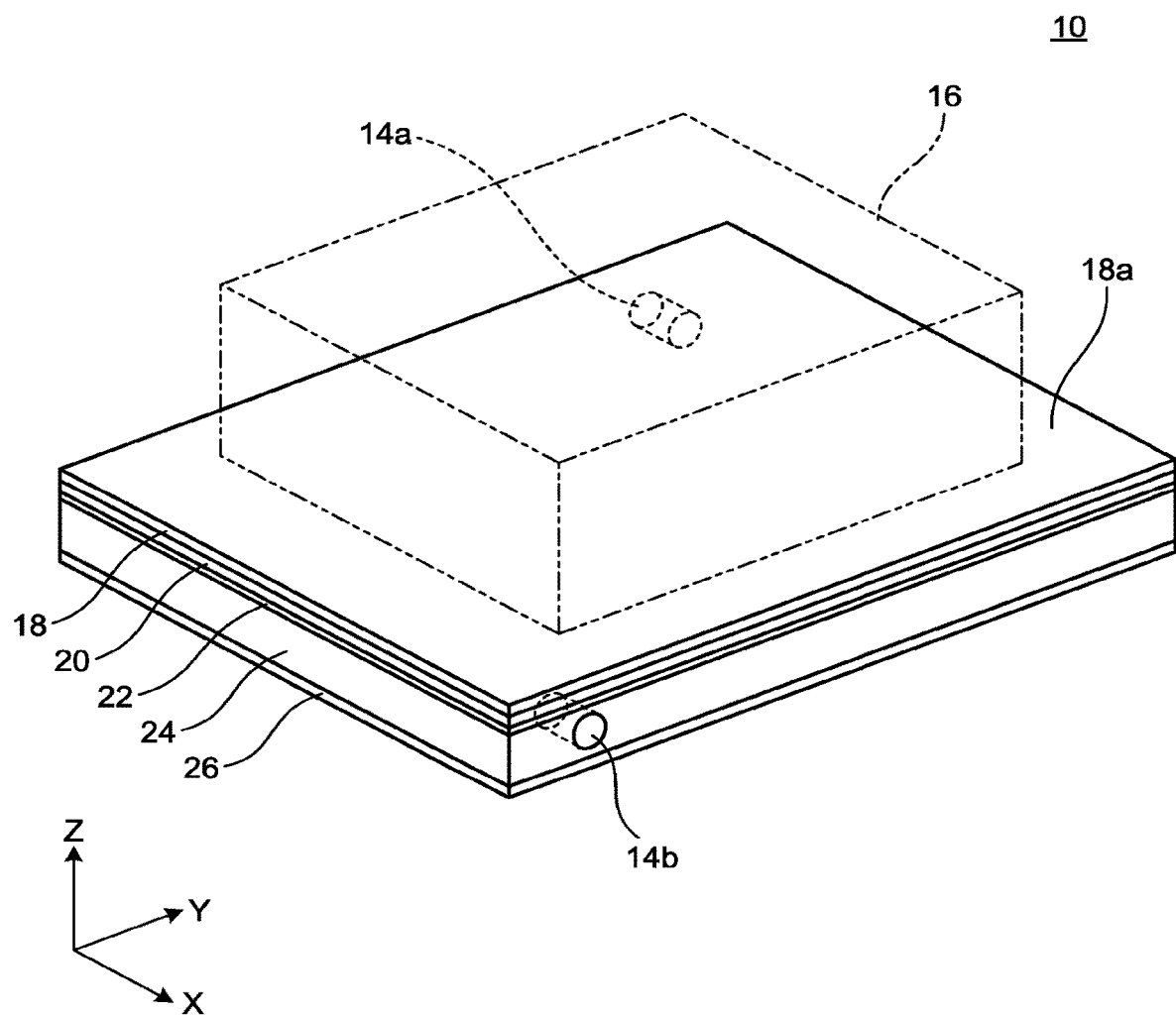
FIG. 1 is a perspective view of a heat sink according to an embodiment of the present invention.
Figure 2:
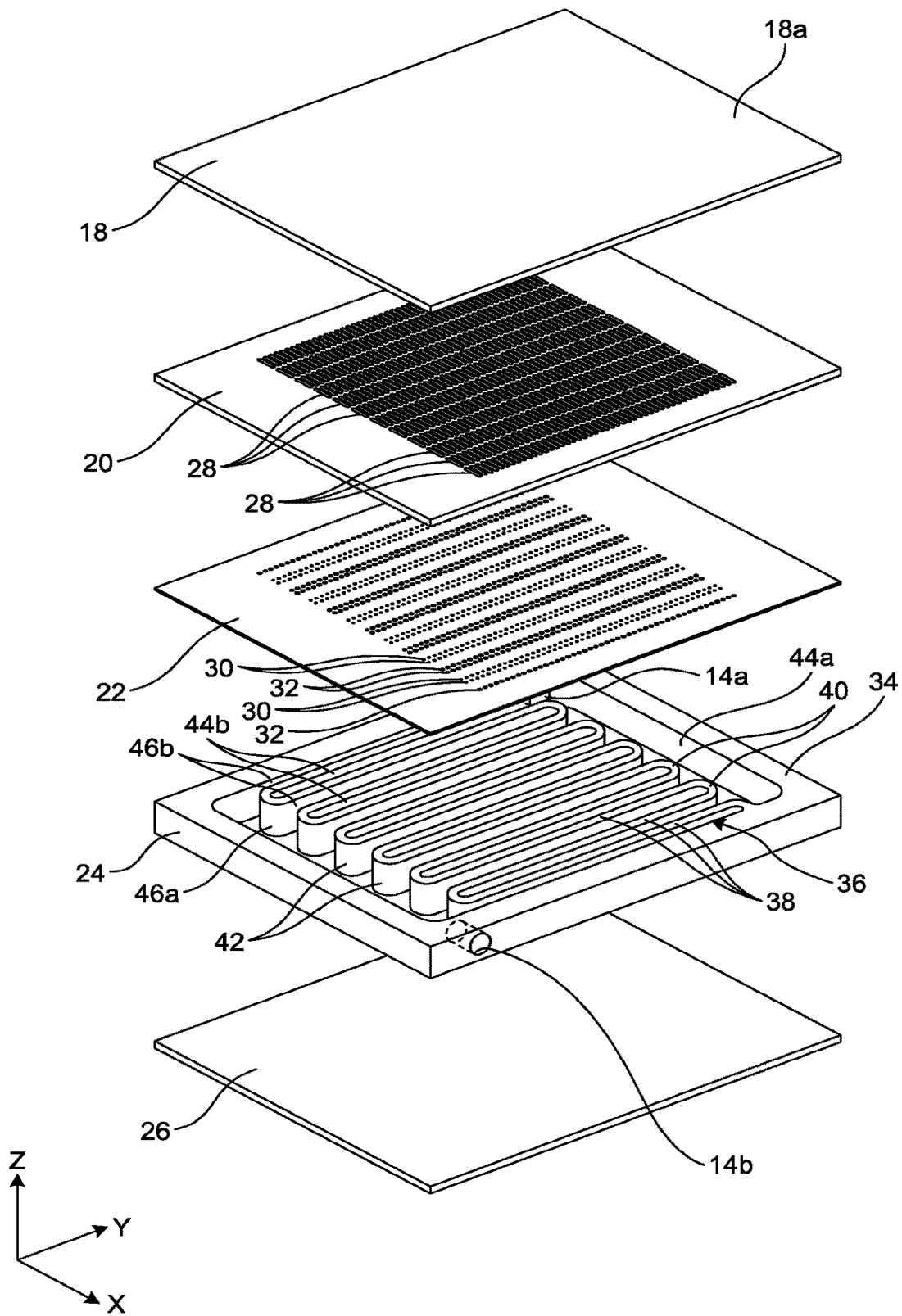
FIG. 2 is an exploded perspective view of the heat sink.

As illustrated in FIGS. 1 and 2, a heat sink 10 according to the present embodiment has a substantially square shape in a plan view and is relatively thin. The heat sink 10 has a pair of a fluid inlet 14a and a fluid outlet 14b facing in the opposite directions and disposed parallel to a set of opposite sides and on respective side surfaces close to diagonally opposite corners. The heat sink 10 is a multilayer cooler configured to cool a heat-generating element (object) 16 in contact with a surface of the heat sink 10 by flowing a coolant (fluid) such as water from the fluid inlet 14a to the fluid outlet 14b. The coolant is not limited to liquid, and may be a gaseous coolant depending on the conditions. The heat-generating element 16 is, for example, an electric device such as a CPU or a semiconductor chip. Although the heat sink 10 and the heat-generating element 16 may be used in any orientation, the following description refers to a surface widely exposed in FIG. 1 as a top surface and to the opposite surface as a bottom surface. For ease of description, the stacking direction may be referred to as a Z-direction, the direction in which the fluid inlet 14a and the fluid outlet 14b open may be referred to as an X-direction, and the direction orthogonal to the X-direction and the Z-direction may be referred to as a Y-direction. The heat sink 10 has a top surface 18a and a bottom surface extending in the X-Y plane. When the heat sink 10 is seen in a plan view or in a stacking direction, it is seen in the Z-direction.

The heat sink 10 includes a heat-receiving plate (heat-receiving layer) 18, a channel plate (channel layer) 20, an orifice plate (orifice layer) 22, a header plate (header layer) 24, and a bottom plate (bottom layer) 26 in this order from the top surface 18a to the bottom surface. These plates have the same outer shape in the plan view. It is preferred that the heat-receiving plate 18, the channel plate 20, and the orifice plate 22 are made of material having high thermal conductivity. It is preferred that the header plate 24 and the bottom plate 26 are made of material having low thermal conductivity to prevent unwanted heat transfer. The material of the respective plates is selected based on, for example, corrosion resistance, strength, workability, diffusion bonding feasibility, and costs, in addition to thermal conductivity. The plates are stacked and bonded by diffusion bonding to form a multilayer structure.

Diffusion bonding can produce many minute microchannels having a high-strength, pressure-resistant structure. The microchannels have a large channel surface area per unit volume, thereby having a higher cooling capacity. The high-strength, pressure-resistant structure allows for a higher supply pressure of the coolant, which in turn can increase the flow rate and the rate of heat transfer. If phase transition occurs in the channels, such as the transition between the liquid and gaseous phases, or vaporization from water to vapor, the flow rate and pressure become unstable and the state of heat transfer may be changed. The heat sink 10, however, can prevent phase transition between the liquid and gaseous phases by increasing the flow rate, thereby achieving a stable heat transfer state. If vaporization or condensation occurs in the channels, the high-strength pressure-resistant structure, which is provided by diffusion bonding, can easily withstand such situations.

The heat-receiving plate 18 is a thin plate having a sufficient surface area for the heat-generating element 16, and the top surface 18a is in contact with the heat-generating element 16 to receive heat. To prevent oxidation or corrosion, the top surface 18a may be appropriately surface-treated.

Figure 3:
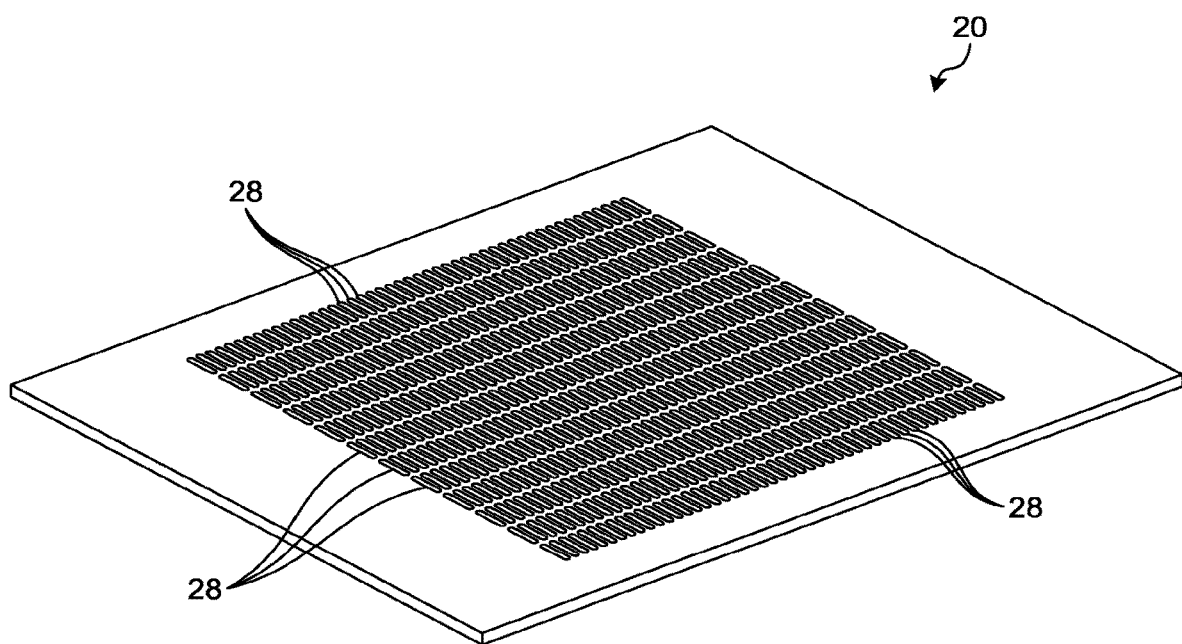
FIG. 3 is a perspective view of a channel plate.
Figure 3:
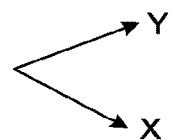

As illustrated in FIG. 3, the channel plate 20 includes many cooling micropaths 28 that are highly densely arranged in a matrix of rows and columns at the center portion. Each cooling micropath 28 is longer in the X-direction than in the Y-direction, has a ratio of the length in the Y-direction to the X-direction of about 1 to 5, and has opposite semicircular ends. The shape of the cooling micropaths 28, or specifically, the channel length, the channel width, and the channel height, may be set in consideration of the flow rate, heat exchange rate, and coolant distribution. The cooling micropaths 28 are arranged in, for example, five or more columns in the X-direction and twenty or more rows in the Y-direction with a sufficiently thin gap therebetween. The channel plate 20 has substantially the same thickness as that of the heat-receiving plate 18. The cooling micropaths 28 and cooling micropaths 28a to 28d, which will be described later, are simple-shaped through-holes on the channel plate 20, and this simple structure facilitates the manufacturing process of the channel plate 20.

Figure 4:
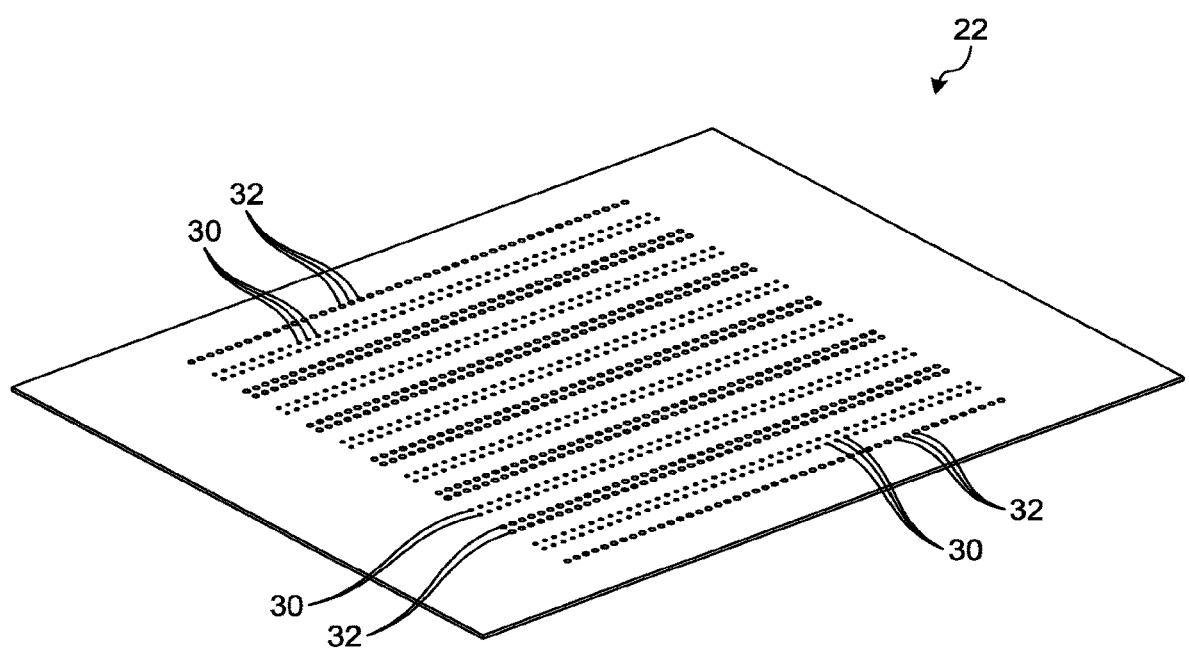
FIG. 4 is a perspective view of an orifice plate.
Figure 4:
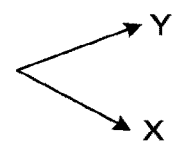

As illustrated in FIG. 4, the orifice plate 22 has jet orifices 30 and drain orifices 32 that are through-holes arranged in a matrix of rows and columns at the center portion. The jet orifices 30 have a slightly smaller diameter than the drain orifices 32. Each column extending in the Y-direction includes 47 jet orifices 30 or 47 drain orifices 32. At the opposite ends in the X-direction, a single column of drain orifices 32 is disposed, and two columns of jet orifices 30 and two columns of drain orifices 32 are alternately arranged between these ends. The number of jet orifices 30 and drain orifices 32 corresponds to the number of cooling micropaths 28.

Each jet orifice 30 forms a pair with a drain orifice 32 adjacent in the X-direction. In other words, N pairs of jet orifices 30 and drain orifices 32 correspond to N cooling micropaths 28. In a transparent plan view, one jet orifice 30 is disposed close to an end of a cooling micropath 28 and one drain orifice 32 is disposed at the other end. The orifice plate 22 is slightly thinner than the heat-receiving plate 18 and the channel plate 20. The jet orifices 30 and the drain orifices 32 are simple-shaped through-holes on the orifice plate 22, and this simple structure facilitates the manufacturing process of the orifice plate 22. This configuration can form narrower and shorter cooling micropaths 28, and the cooling micropaths 28 can be arranged in more rows in the Y-direction and more columns in the X-direction, which in turn can increase thermal conductivity.

Figure 5:
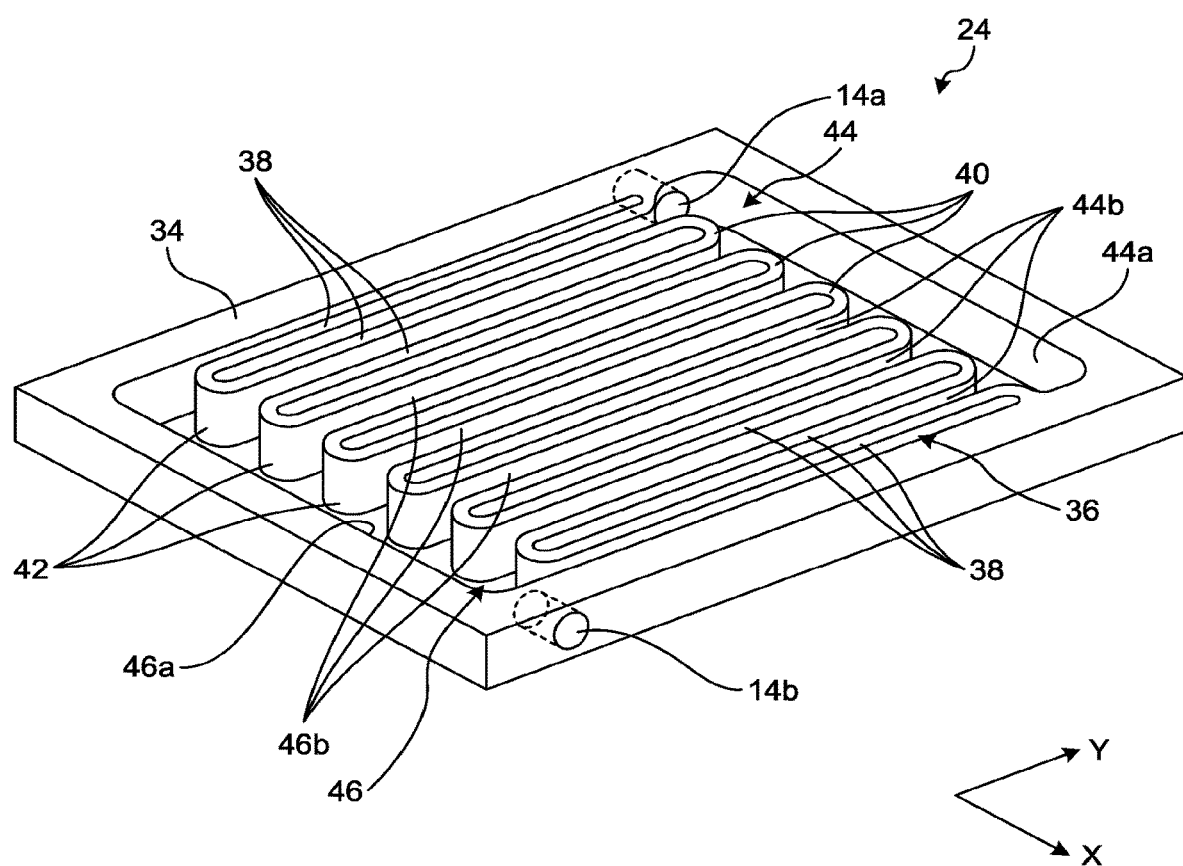
FIG. 5 is a perspective view of a header plate.

As illustrated in FIG. 5, the header plate 24 is several times as thick as the other plates, thereby allowing the header plate 24 to supply and drain a sufficient amount of coolant. The header plate 24 has the fluid inlet 14a, the fluid outlet 14b, a peripheral wall 34 surrounding the four sides of the header plate 24, and a baffle 36 having a waveform with a deep depth and disposed in a region surrounded by the peripheral wall 34. The fluid inlet 14a and the fluid outlet 14b are in fluid communication with the inner space defined by the peripheral wall 34, and are separated by the baffle 36. The fluid inlet 14a and the fluid outlet 14b may be provided to, for example, diagonally opposite corners of the bottom plate 26. However, disposing the fluid inlet 14a and the fluid outlet 14b at the side surfaces of the header plate 24 close to the diagonally opposite corners enables linear arrangement of the fluid inlet 14a and the fluid outlet 14b relative to an entrance channel 44a (see FIG. 2) and an exit channel 46a, respectively, allowing the coolant to flow smoothly. The header plate 24 has a single fluid inlet 14a and a single fluid outlet 14b, but may have a plurality of fluid inlets 14a and fluid outlets 14b. The fluid inlet 14a and the fluid outlet 14b are connected to coolant tubes via joints. A coolant at an adequately low temperature is supplied from a pump to the fluid inlet 14a, and the coolant is drained from the fluid outlet 14b to a drain line or to a radiator. A filter may be provided between the pump and the fluid inlet 14a.

The baffle 36 includes 12 parallel plates 38, first end plates 40 that close every other gap between the parallel plates 38 at an end, and second end plates 42 that close, alternately with the first end plates 40, every other gap at the other end. In other words, the first end plates 40 and the second end plates 42 alternately close openings of the parallel plates 38, which are disposed parallel to each other, at an end and the other end, thereby forming a waveform with a deep depth. The parallel plates 38 extend in the Y-direction and are arranged in the X-direction at regular intervals. The thickness of the parallel plates 38 in the X-direction is slightly smaller than the gap between the parallel plates 38 in the X-direction.

The first end plates 40 and the second end plates 42 are semicircular plates that smoothly connect the ends of respective pairs of parallel plates 38 and alternately close the openings, allowing the coolant to flow smoothly. The first end plates 40 are disposed close to an extension of the fluid inlet 14a, and the second end plates 42 are disposed close to an extension of the fluid outlet 14b. The distance between the first end plates 40 and the second end plates 42 in the Y-direction accounts for about 80% of the length in the Y-direction of the region defined by the peripheral wall 34.

The baffle 36 and the peripheral wall 34 define a supply channel 44 that guides a coolant from the fluid inlet 14a to the jet orifices 30 and a drain channel 46 that guides a coolant from the drain orifices 32 to the fluid outlet 14b. The supply channel 44 includes one entrance channel 44a and, for example, six supply sub-channels 44b, and the drain channel 46 includes one exit channel 46a and, for example, seven drain sub-channels 46b.

The entrance channel 44a extends in the X-direction along the extension of the fluid inlet 14a, and is wide enough to introduce a sufficient amount of coolant. Each supply sub-channel 44b is flanked by the parallel plates 38 and extends in the Y-direction with an end opening toward the entrance channel 44a and the other end closed by a second end plate 42.

The exit channel 46a extends in the X-direction along the extension of the fluid outlet 14b, and has the same width as the entrance channel 44a. Each width of the entrance channel 44a and the exit channel 46a accounts for about 10% of the length in the Y-direction of the region defined by the peripheral wall 34. The five inner drain sub-channels 46b are flanked by the parallel plates 38 and the two outer drain sub-channels 46b are each flanked by one parallel plate 38 and the peripheral wall 34. Each drain sub-channel 46b extends in the Y-direction with an end opening toward the exit channel 46a and the other end closed by a first end plate 40. The two outer channels are different from the five inner channels in shape and configuration, but for ease of description, these channels are all referred to as the drain sub-channels 46b.

The supply sub-channels 44b alternate with the drain sub-channels 46b with a parallel plate 38 interposed therebetween. The six supply sub-channels 44b and the five inner drain sub-channels 46b have the same width, and the two outer drain sub-channels 46b have half the width. In this regard, the six supply sub-channels 44b have the same channel area and the volume as those of the seven drain sub-channels 46b. The number of jet orifices 30 per channel volume of each supply sub-channel 44b is equal to the number of drain orifices 32 per channel volume of each drain sub-channel 46b. Of course, the width, volume, and number may vary depending on the design specification.

The entrance channel 44a and the exit channel 46a are disposed at the opposite positions in the Y-direction, or in other words, disposed close to the opposite sides, and are so distant from each other that thermal interference between the entrance channel 44a and the exit channel 46a can be small.

In the same manner, the fluid inlet 14a and the fluid outlet 14b are disposed close to diagonally opposite corners. This configuration can further prevent thermal interference between the upstream and the downstream coolant. The supply sub-channels 44b and the drain sub-channels 46b are parallel to each other and linearly extend in the Y-direction. This structure allows the coolant to flow smoothly. The shape of the region surrounded by the peripheral wall 34, or more specifically, the supply channel 44, the drain channel 46, and the baffle 36 have a symmetrical shape in the X-direction, which provides a balanced flow of the coolant. The baffle 36 has a waveform with a deep depth and this structure can suitably distribute the incoming coolant and suitably drain the coolant after removing heat, thereby increasing the cooling capacity. The parallel plates 38 are adequately thick, and thus prevent thermal interference between the supply sub-channels 44b and the drain sub-channels 46b and have a high strength.

Figure 6:
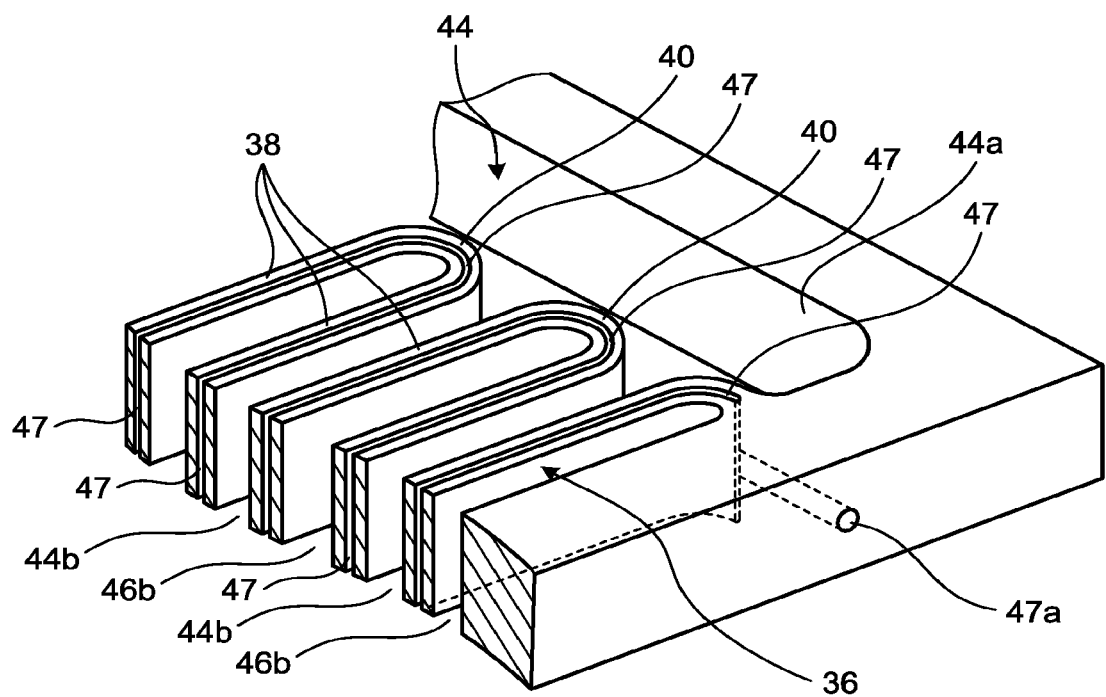
FIG. 6 is a partially enlarged perspective cross-sectional view of the header plate.

As illustrated in FIG. 6, the baffle 36 has a thermally insulating slit (insulator) 47 extending along the entire length and passing through the baffle 36 in the stacking direction. Thus, the baffle 36 has a dual layer structure in the thickness direction. Providing the thermally insulating slit 47 can further prevent the thermal interference between the supply channel 44 and the drain channel 46, thereby increasing the cooling capacity of the heat sink 10. Although FIG. 6 illustrates the thermally insulating slit 47 in the parallel plates 38 and the first end plates 40, the thermally insulating slit 47 is also provided to the second end plates 42. For ease of illustration, the thermally insulating slit 47 is omitted from FIGS. 2, 5, and 6.

The thermally insulating slit 47 is not necessarily provided to the entire length of the baffle 36. Considering an easier manufacturing process or strength, the thermally insulating slit 47 at least partially provided to the baffle 36 can achieve a similar effect. For example, the thermally insulating slit 47 may be provided only to the parallel plates 38. The thermally insulating slit 47 does not necessarily pass through in the stacking direction, and may be, for example, blind grooves opening upward and blind grooves opening downward that are disposed at a certain distance. The thermally insulating slit 47 may be empty or filled with a suitable thermally insulating material (e.g., dry-cured liquid material). The baffle 36 including the thermally insulating slit 47 has a dual-layer structure, but the baffle 36 may have three or more layers by providing a plurality of thermally insulating slits 47. The header plate 24 may have an air vent 47a at a side surface in air communication with an end of the slit 47. The air vent 47a may be a groove exposed to the top surface or bottom surface of the header plate 24 and closed by the orifice plate 22 or the bottom plate 26 to form a hole shape.

The bottom plate 26 (see FIG. 2) has the same shape as the heat-receiving plate 18, and is disposed at the bottom of the header plate 24 to close the supply channel 44 and the drain channel 46 from the bottom. The bottom plate 26 may have a slit to partially or entirely open the thermally insulating slit 47. When the thermally insulating slit 47 is filled with an insulating material, the insulating material may be supplied from the slit on the bottom plate 26 after the header plate 24 and the bottom plate 26 are bonded by diffusion bonding. The insulating material may be injected from the air vent 47a.

Figure 7:
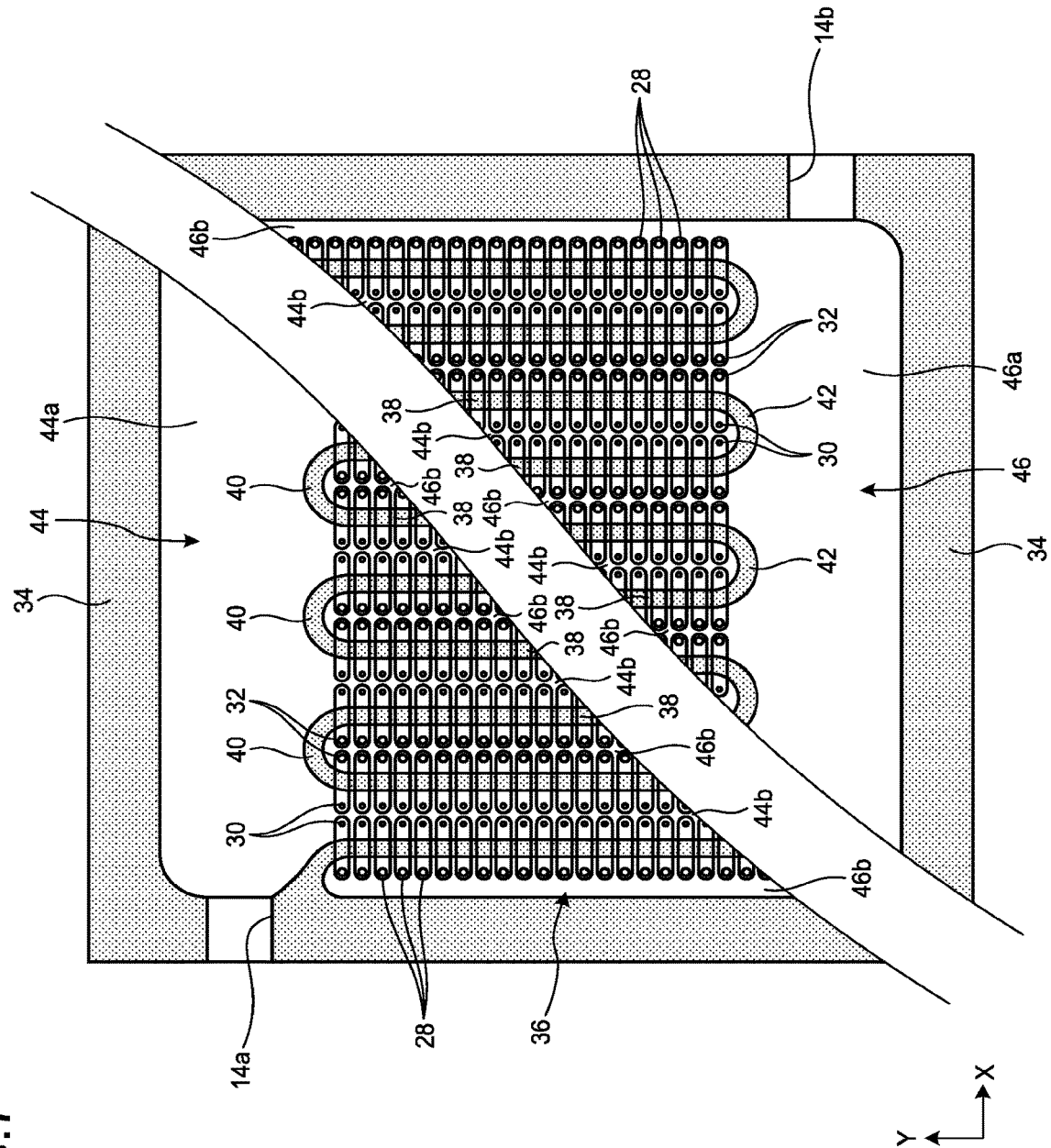
FIG. 7 is a transparent plan view of the heat sink.

As illustrated in FIG. 7, the cooling micropaths 28 each overlap a supply sub-channel 44b and a drain sub-channel 46b over a parallel plate 38 in the transparent plan view. The jet orifices 30 open at positions overlapping the cooling micropaths 28 and the supply sub-channels 44b, and the drain orifices 32 open at positions overlapping the cooling micropaths 28 and the drain sub-channels 46b. Each cooling micropath 28 connects one jet orifice 30 with one drain orifice 32. This structure can provide a stable and balanced flow of the coolant.

In the transparent plan view, the jet orifices 30 are arranged in two lines in the Y-direction at positions overlapping the respective supply sub-channels 44b, and are provided to substantially the entire length of the supply sub-channels 44b. The drain orifices 32 are arranged in two lines in the Y-direction at positions overlapping the respective drain sub-channels 46b, and are provided to substantially the entire length of the drain sub-channels 46b.

With this configuration, the cooling micropaths 28 are arranged in a matrix of rows and columns and can uniformly cool the entire surface. Each supply sub-channel 44b supplies the coolant to the neighboring drain sub-channels 46b through the jet orifices 30 arranged in two lines, and each drain sub-channel 46b receives the coolant from the neighboring supply sub-channels 44b through the drain orifices 32 arranged in two lines, whereby efficient and balanced cooling is provided.

Figure 8:
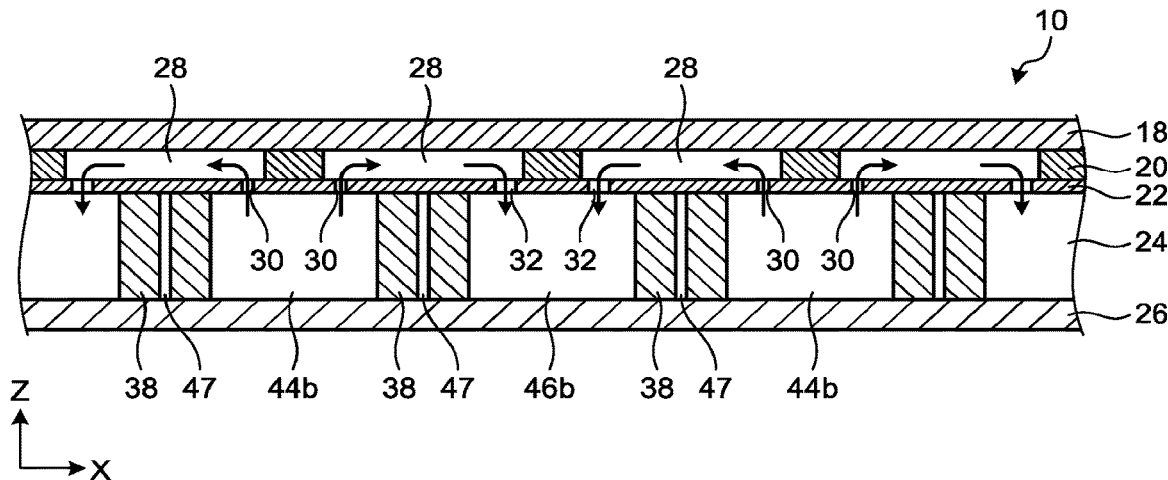
FIG. 8 is a cross-sectional side view of the heat sink.

As illustrated in FIG. 8, the coolant in the supply sub-channels 44b is jetted into the cooling micropaths 28 through the small-diameter jet orifices 30 and hits the bottom surface of the heat-receiving plate 18 to cool the heat-receiving plate 18. The jet orifices 30 have the function of orifices. The coolant removes heat from the heat-receiving plate 18 while flowing in the cooling micropaths 28, and then is drained through the drain orifices 32 to the drain sub-channels 46b. The cooling micropaths 28 cover a broad range of the heat-receiving plate 18, thereby achieving higher heat-removing efficiency. The cooling micropaths 28 have a narrow shape that allows the coolant to flow smoothly in a laminar flow with a smaller pressure drop. This structure allows for a higher supply pressure to increase the flow rate. The cooling micropaths 28, which are what is called microchannels, are minute and thus have a small channel cross-section, but the cooling micropaths 28 have a large channel surface area per unit volume and thus have a high cooling efficiency.

As described above, the heat sink 10 has a multilayer three-dimensional structure configured to distribute and supply a coolant to many cooling micropaths 28 at a desired rate. This multilayer structure directs the coolant to be jetted from the jet orifices 30 into the cooling micropaths 28 extending in a direction orthogonal to the stacking direction to remove heat from the heat-receiving plate 18. This structure can increase the cooling capacity of the heat sink 10. The coolant is supplied from the fluid inlet 14a to the sufficiently wide entrance channel 44a extending in the X-direction. Since the entrance channel 44a is away from the exit channel 46a, thermal interference between the channels can be prevented. The coolant is uniformly supplied in the Y-direction along the six supply sub-channels 44b. The supply sub-channels 44b are long enough to supply the coolant to the deep positions in the Y-direction. Since the supply channel 44 and the drain channel 46 are symmetrical, the coolant is also efficiently drained.

Although the heat sink 10 has a three-dimensional structure made of a plurality of plates bonded by diffusion bonding, the heat sink 10 is made of a relatively few plates each having a simple shape, and thus can be easily manufactured. Since the heat sink 10 has a high cooling efficiency, it can be smaller and thinner in size. Moreover, the heat sink 10 can be driven at a low flow rate, which can in turn reduce the overall size including pumps and pipes, weight, and structural complexities. The channels of the heat sink 10 are suitably formed to suppress pressure drop, thereby achieving low energy consumption. If driven at a low flow rate, the heat sink 10 has a low thermal resistance due to a high cooling efficiency. Thus, the heat sink 10 is suitable for use in removing heat from a high-density object generating high-temperature heat.

The heat sink 10 is configured to cool the heat-generating element 16. However, since the heat sink 10 has a low thermal resistance, the application of the heat sink 10 is not limited to this. The heat sink 10 can be used for heating an object in contact with it by flowing adequately hot fluid.

Described next are modifications of the heat sink 10.

Figure 9:
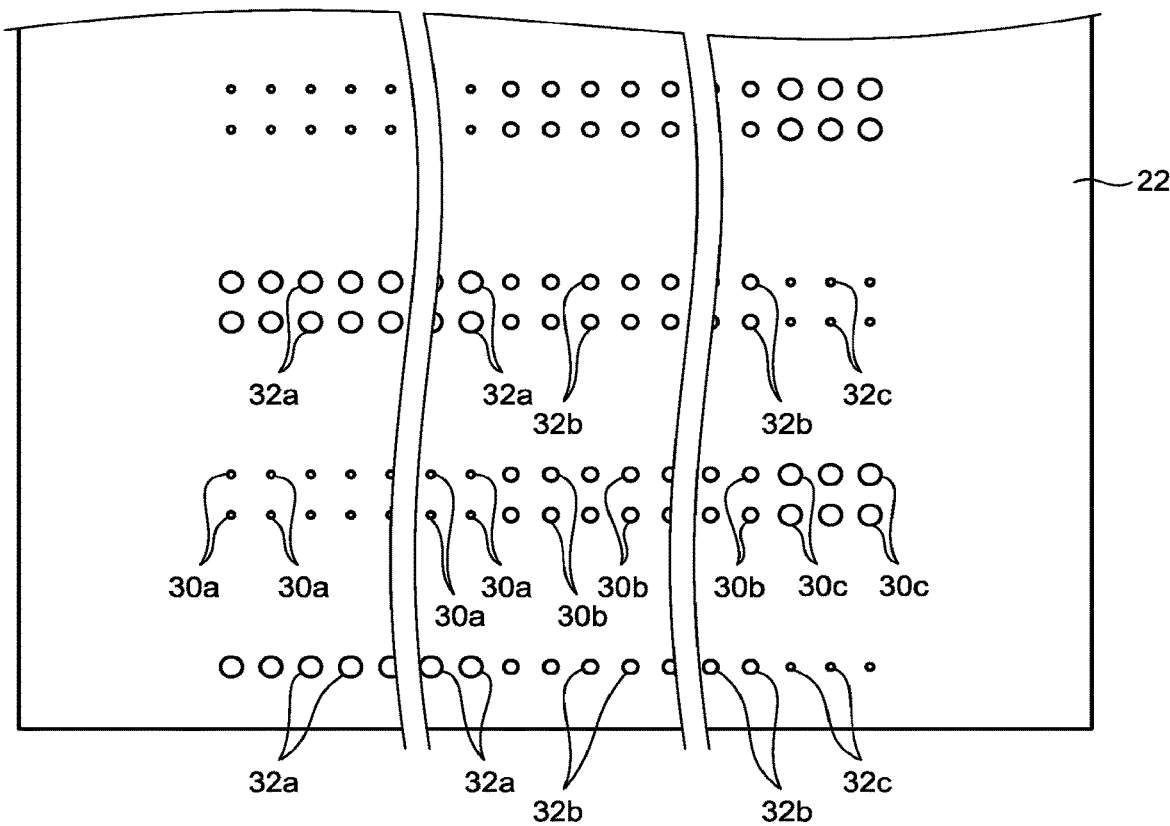
FIG. 9 is a plan view of an orifice plate according to a modification.

As illustrated in FIG. 9, the orifice plate 22 may have jet orifices 30a, 30b, 30c, . . . and drain orifices 32a, 32b, 32c, . . . having different diameters depending on the locations on the orifice plate 22. This configuration can adjust the cooling effect to more uniformly cool the heat-receiving plate 18 or can distribute the cooling area in accordance with the thermal distribution of the heat-generating element 16.

Figure 10:
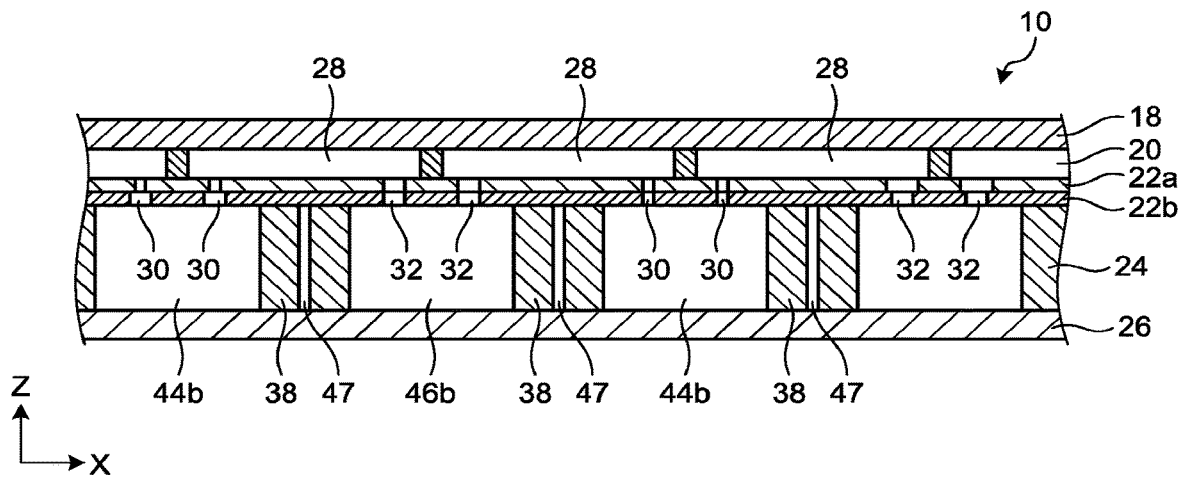
FIG. 10 is a cross-sectional side view of a heat sink according to a first modification.

As illustrated in FIG. 10, the heat sink 10 may include two (or three or more) orifice plates 22a and 22b that are stacked by diffusion bonding and have jet orifices 30 and/or drain orifices 32 having different diameters depending on the locations on the orifice plates. Combining the orifice plates 22a, 22b, . . . provides a greater adjustment range of the diameter and the length of the jet orifices 30 and/or the drain orifices 32. This configuration can supply a coolant to the cooling micropaths 28 at a desired flow rate. This structure may be formed by 3D printing. The jet orifices 30 and the drain orifices 32 may have a circular shape, a rectangular shape, or other shapes such as a star shape.

Figure 11:
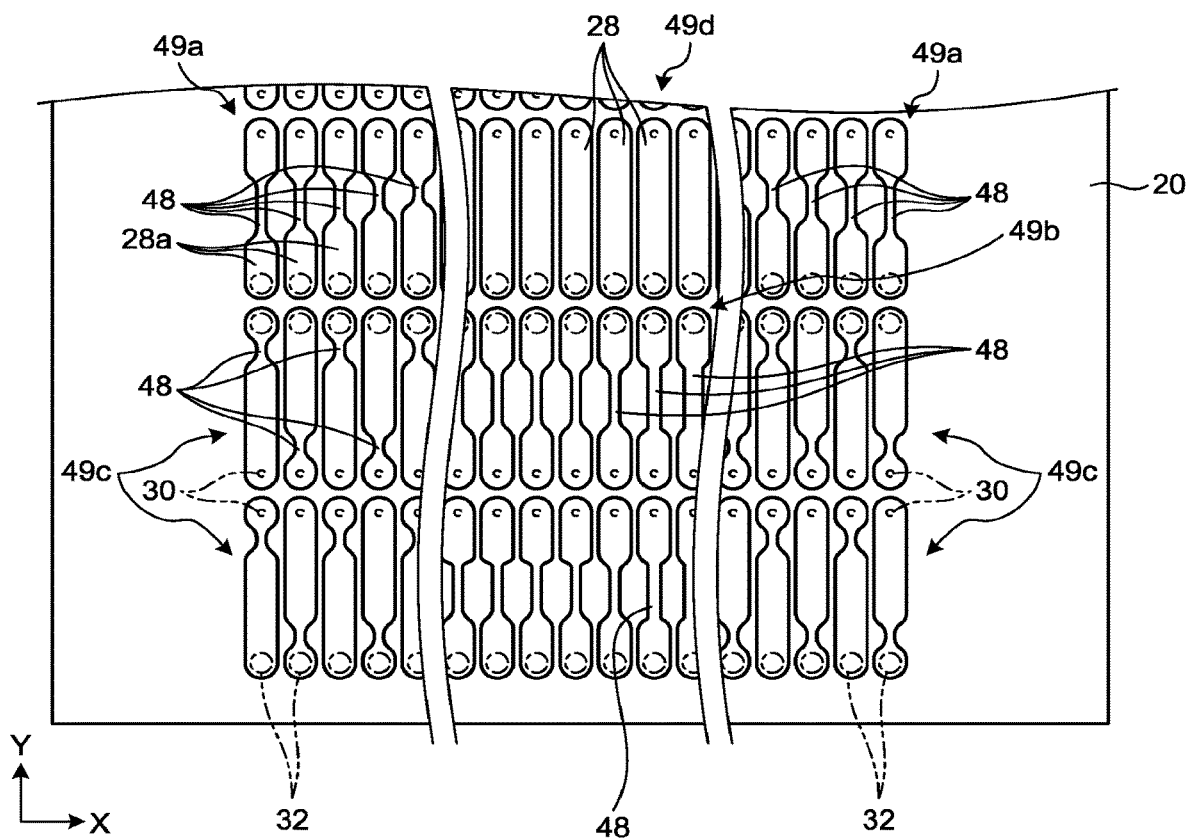
FIG. 11 is a plan view of a channel plate according to the first modification.

As illustrated in FIG. 11, the channel plate 20 may have cooling micropaths 28a as a first modification. The cooling micropaths 28a are different from the cooling micropaths 28 in shape depending on the locations on the channel plate 20. Providing different shapes of cooling micropaths 28a can adjust the cooling effect to more uniformly cool the heat-receiving plate 18, or can distribute the cooling area in accordance with the thermal distribution of the heat-generating element 16. The thermal distribution of the heat-generating element 16 does not always have a clear tendency. In this regard, the shape of the cooling micropaths 28 and 28a may be adjusted by narrow portions 48 provided at different positions in the longitudinal direction of the cooling micropaths or having different lengths, based on simulations, experiments, and expert rules. For example, the narrow portions 48 may have a different length that sequentially changes in the X-direction as in a region 49a, may have a different width that sequentially changes in the X-direction as in a region 49b, or may be disposed at different positions alternately changing in the X-direction as in a region 49c. These changes may be set in the Y-direction. The channel plate 20 may have a group of cooling micropaths 28 with no narrow portions as in a region 49d.

Figure 12:
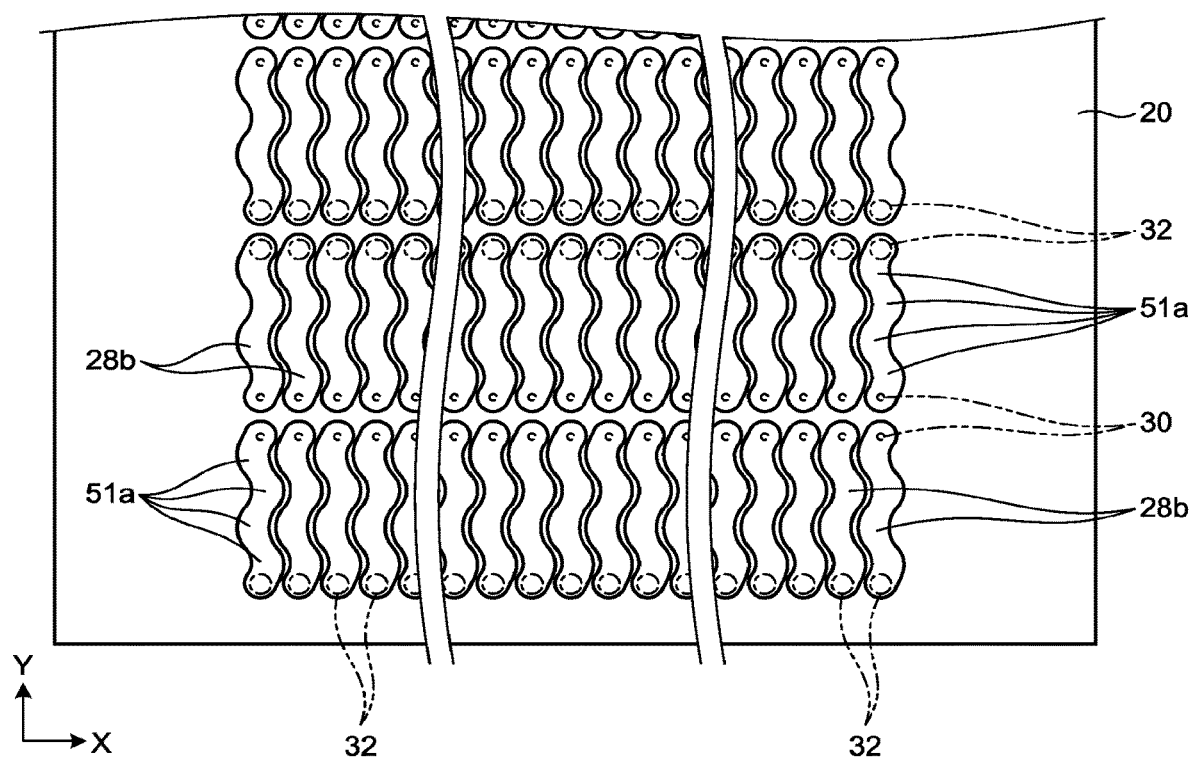
FIG. 12 is a plan view of a channel plate according to a second modification.

As illustrated in FIG. 12, the channel plate 20 may have cooling micropaths 28b as a second modification. Each cooling micropath 28b connects one jet orifice 30 with one drain orifice 32 in the same manner as the cooling micropath 28a, but the cooling micropath 28 has a linear shape whereas the cooling micropath 28b has a non-linear shape having one or more bent portions 51a. In FIG. 12, for example, the cooling micropaths 28b have a wavy shape having four arcuate bent portions 51a. The cooling micropaths 28b may have a linear portion between two bent portions 51a or generally have a sinusoidal shape. The cooling micropaths 28b produce turbulent flow of a coolant hitting the channel surface and this turbulent flow effect can increase the thermal conductivity. The cooling micropaths 28b are longer than the cooling micropaths 28 and may be applied when the parallel plates 38 become thicker due to, for example, a lower limit in size from a manufacturing point of view or a high pressure-resistant target.

Figure 13:
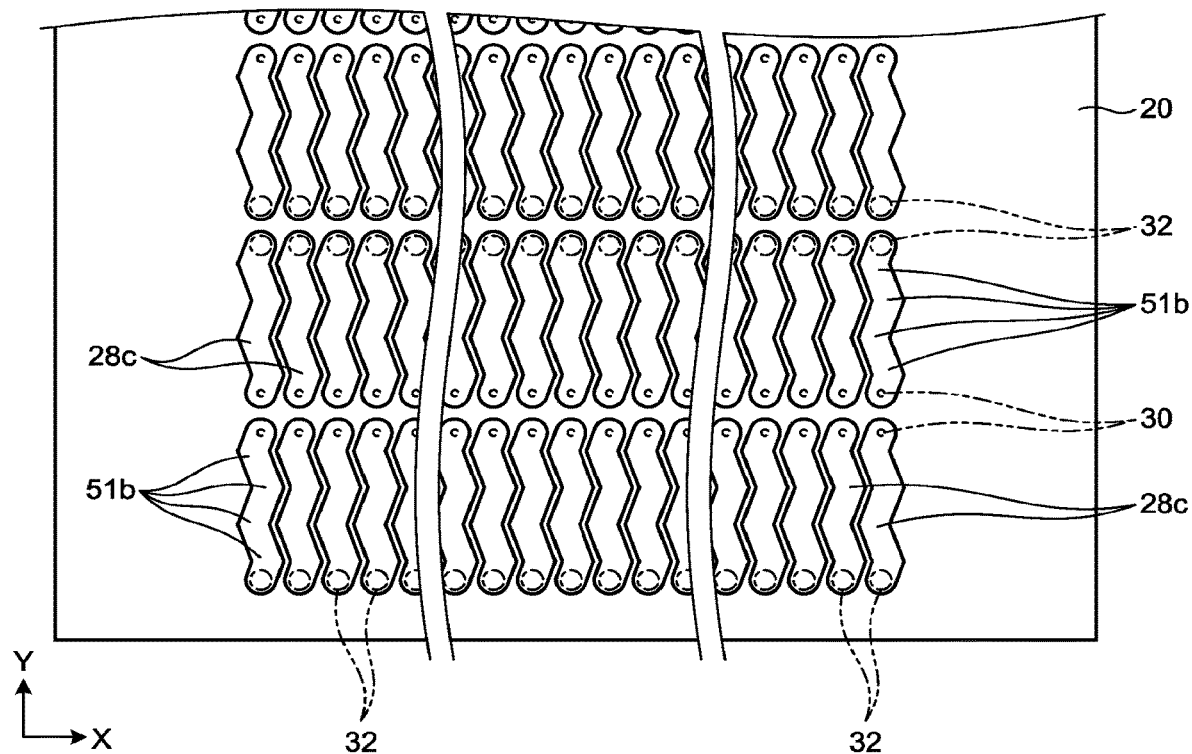
FIG. 13 is a plan view of a channel plate according to a third modification.

As illustrated in FIG. 13, the channel plate 20 may have cooling micropaths 28c as a third modification. Although the cooling micropaths 28b have the arcuate bent portions 51a, the cooling micropaths 28c have edged bent portions 51b. The cooling micropaths 28c produce a greater turbulent flow of the coolant more strongly hitting the channel surface.

Figure 14:
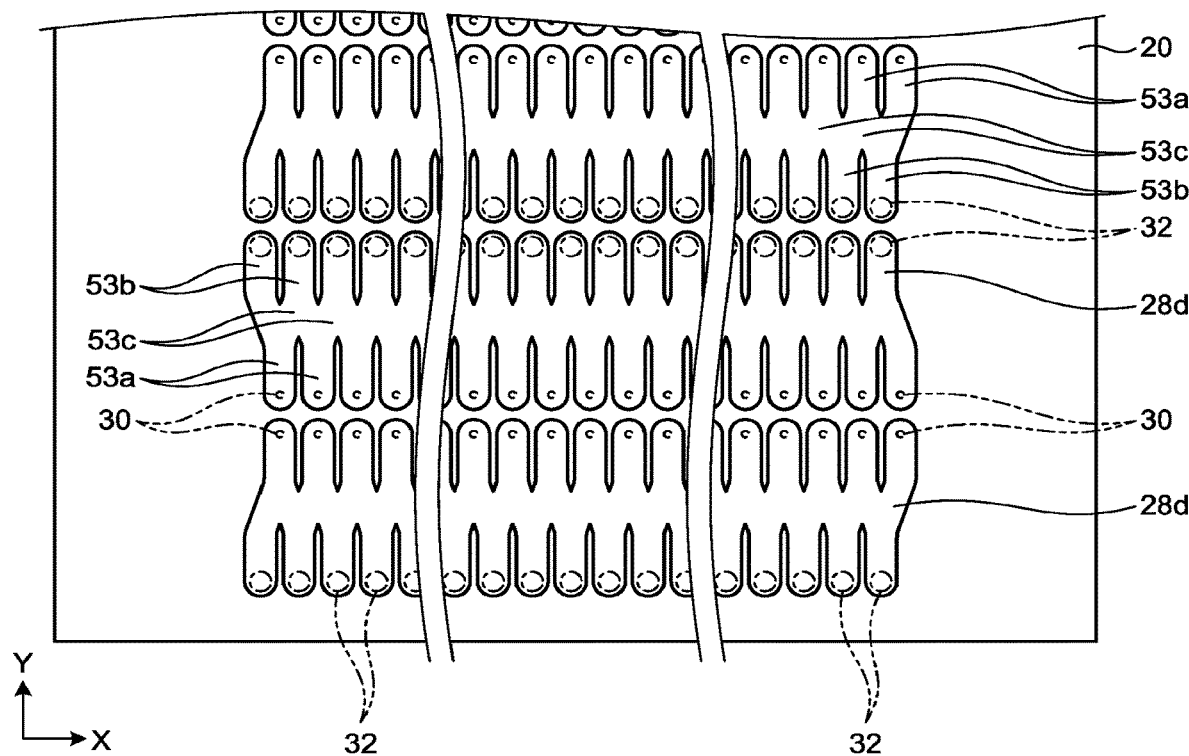
FIG. 14 is a plan view of a channel plate according to a fourth modification.

As illustrated in FIG. 14, the channel plate 20 may have cooling micropaths 28d as a fourth modification. Each cooling micropath 28d includes upstream cooling paths 53a connecting with the jet orifices 30, downstream cooling paths 53b connecting with the drain orifices 32, and junctions 53c at which the respective upstream cooling paths 53a bifurcate into two branches and the neighboring branches join together to connect with the respective downstream cooling paths 53b. In this case, the line of jet orifices 30 is offset from the line of the drain orifices 32 by a half pitch in the X-direction. The junctions 53c have bifurcating portions and joining portions forming acute angles. The branches in the junctions 53c are short, and the bifurcating portions are in immediate vicinity of the joining portions.

In the upstream cooling paths 53a of the cooling micropaths 28d, fluid layers flowing closer to the channel surfaces exchange heat more efficiently and thus the temperate rises at a higher rate, whereas fluid layers flowing closer to the channel center exchange heat less efficiently and thus the temperature rises at a lower rate. After passing through the junctions 53c, however, the fluid layers flowing close to the channel surfaces of the upstream cooling paths 53a then flow in the center of the downstream cooling paths 53b, and the fluid layer flowing in the center of the upstream cooling paths 53a then flows close to the channel surfaces of the downstream cooling paths 53b. Exchanging the fluid layers between the center and the channel surfaces produces a larger temperature difference between the fluid and the channel surfaces and can in turn increase the heat transfer efficiency.

Figure 15:
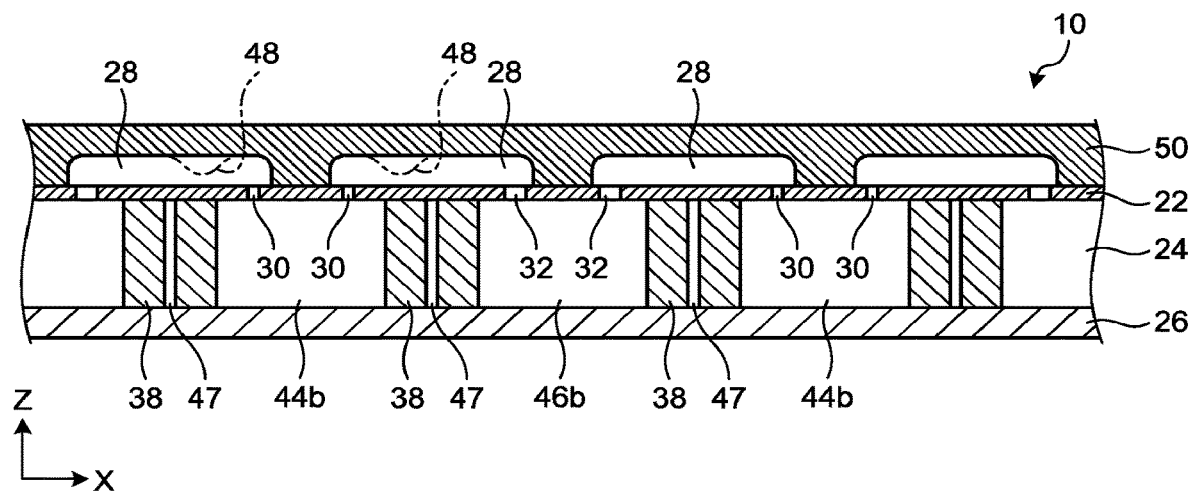
FIG. 15 is a cross-sectional side view of a heat sink according to the second modification.

As illustrated in FIG. 15, the heat sink 10 may include a half-etch plate 50 instead of the heat-receiving plate 18 and the channel plate 20. The half-etch plate 50 has cooling micropaths 28 (or cooling micropaths 28a to 28d, and so forth) that are blind grooves, not through-holes, on the bottom surface. Using the half-etch plate 50 can reduce the number of plates, thereby reducing one of the processes of diffusion bonding. To form the blind grooves, the cooling micropaths 28 are formed by etching, laser processing, or machine processing.

Figure 16:
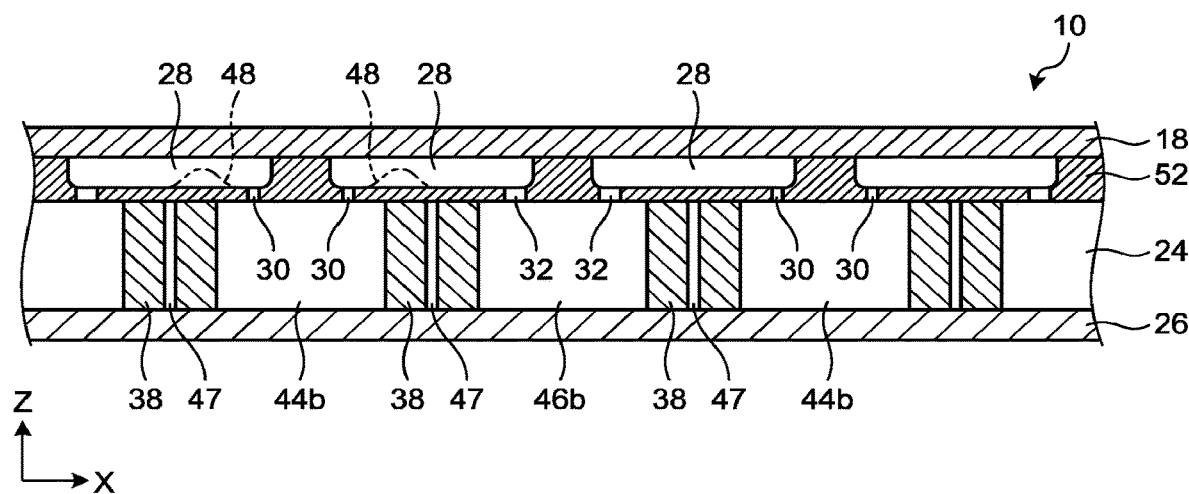
FIG. 16 is a cross-sectional side view of a heat sink according to the third modification.

As illustrated in FIG. 16, the heat sink 10 may include a half-etch plate 52 instead of the channel plate 20 and the orifice plate 22. The half-etch plate 52 has cooling micropaths 28 that are half-etched grooves, not through-holes, on the top surface. Each cooling micropath 28 has a jet orifice 30 at an end and a drain orifice 32 at the other end. The orifices pass through the half-etch plate 52. Using the half-etch plate 52 can reduce the number of plates, thereby reducing one of the processes of diffusion bonding.

Figure 17:
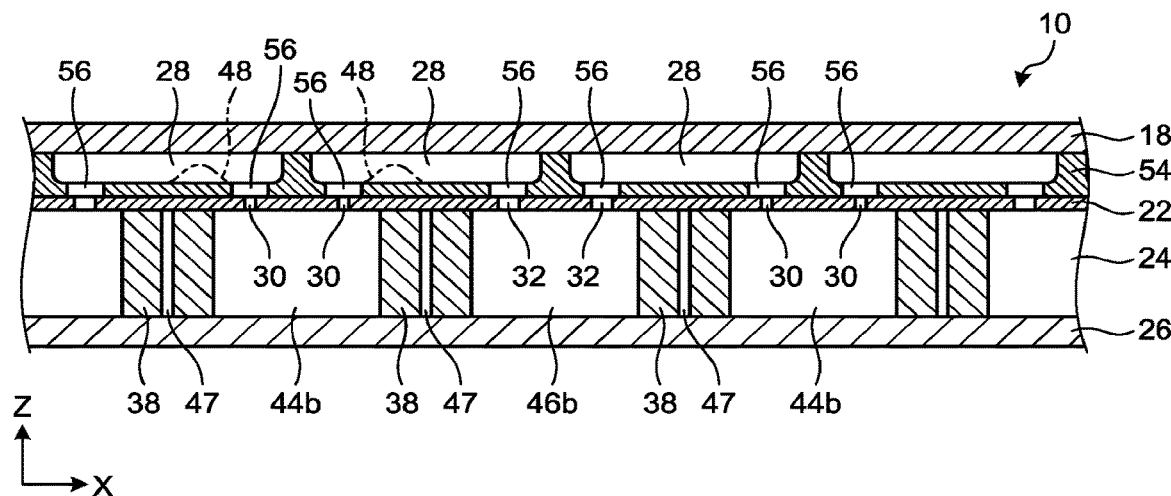
FIG. 17 is a cross-sectional side view of a heat sink according to the fourth modification.

As illustrated in FIG. 17, the heat sink 10 may include a half-etch plate 54 instead of the channel plate 20. The half-etch plate 54 has cooling micropaths 28 that are half-etched grooves, not through-holes, on the top surface. Each cooling micropath 28 has through-holes 56 having a relatively large diameter at the opposite ends. The through-holes 56 may have a different diameter depending on the locations on the jet orifices 30 and the drain orifices 32 that are coaxially connecting with the through-holes 56. Using the half-etch plate 54 provides greater design flexibility. The cooling micropaths 28 on the half-etch plates 50, 52, and 54 may have a variation in etch depth in the Z-direction in the middle of the cooling micropaths 28 depending on the locations to form a narrow portion 48 similar to those illustrated in FIG. 11.

Figure 18:
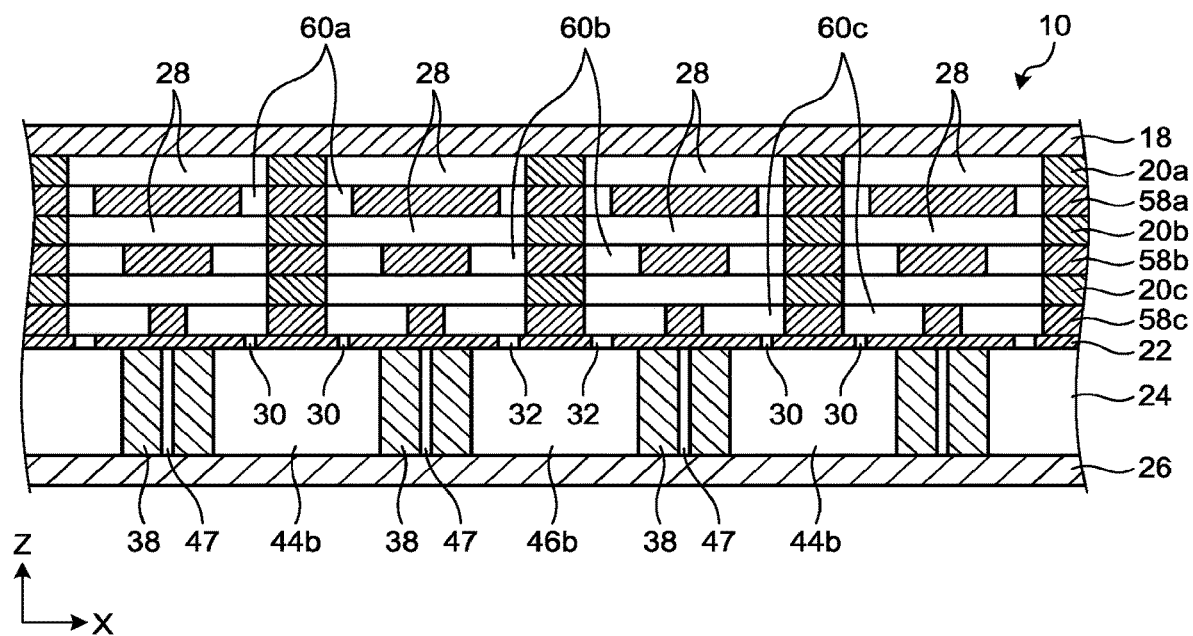
FIG. 18 is a cross-sectional side view of a heat sink according to a fifth modification.
Figure 19:
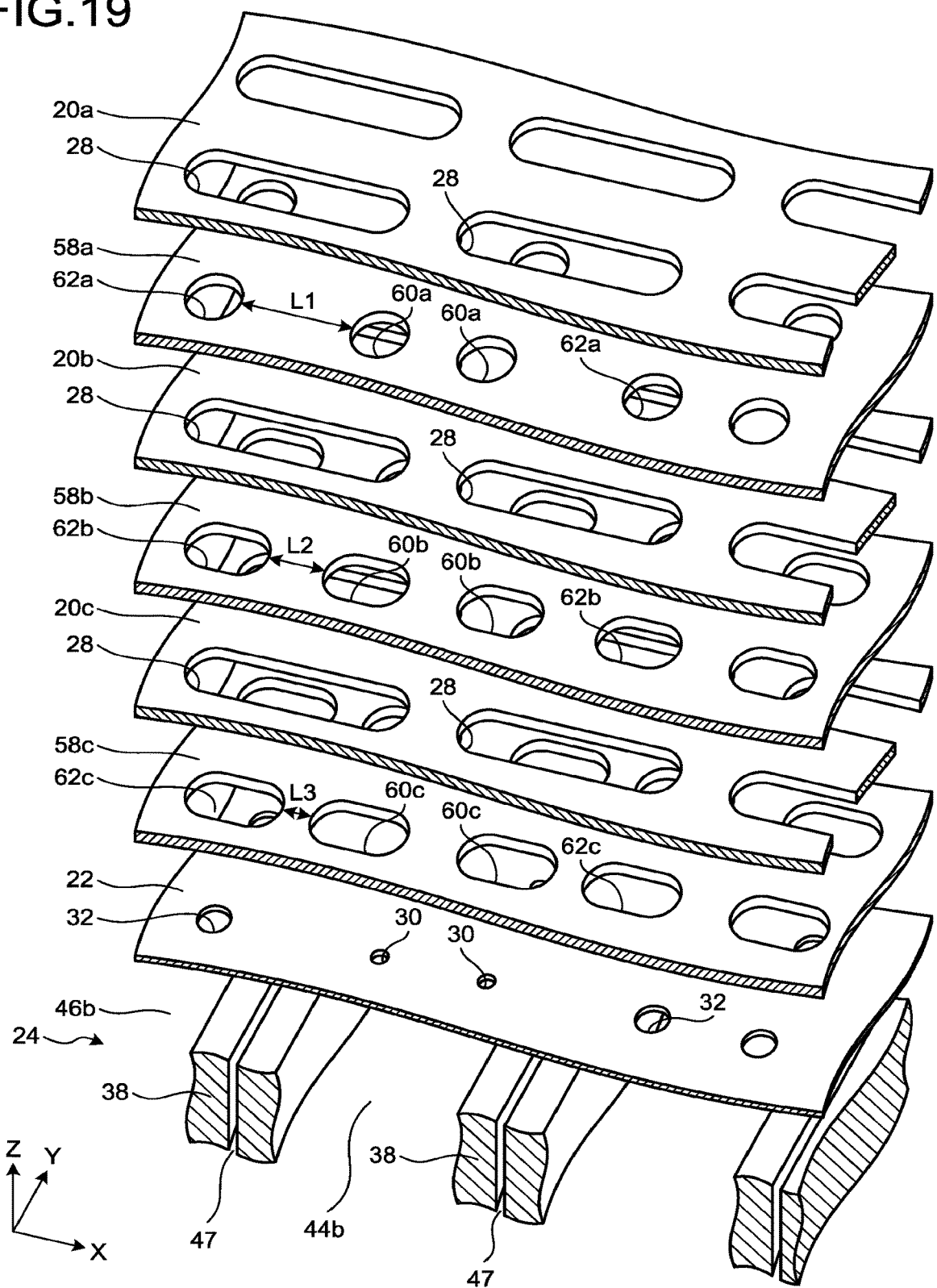
FIG. 19 is a partially exploded perspective view of the heat sink according to the fifth modification.

As illustrated in FIGS. 18 and 19, the heat sink 10 may include a plurality of channel plates 20 (hereinafter referred to as three channel plates 20a, 20b, and 20c), and may include intermediate plates (intermediate layers) 58a, 58b, and 58c between the three channel plates 20a to 20c and between the orifice plate 22 and the channel plates 20a to 20c. The channel plates 20a to 20c may be the same as the channel plate 20 described above or, for example, may have a different thickness. The intermediate plate 58a has intermediate jet orifices 60a at positions including the jet orifices 30 and has intermediate drain orifices 62a at positions including the drain orifices 32 in the transparent plan view. The intermediate plate 58b has intermediate jet orifices 60b at positions including the jet orifices 30 and has intermediate drain orifices 62b at positions including the drain orifices 32 in the transparent plan view. The intermediate plate 58c has intermediate jet orifices 60c at positions including the jet orifices 30 and has intermediate drain orifices 62c at positions including the drain orifices 32 in the transparent plan view. In the transparent plan view, the intermediate jet orifices 60c include the intermediate jet orifices 60b, and the intermediate jet orifices 60b include the intermediate jet orifices 60a. In the transparent plan view, the intermediate drain orifices 62c include the intermediate drain orifices 62b, and the intermediate drain orifices 62b include the intermediate drain orifices 62a.

The intermediate jet orifices 60a and the intermediate drain orifices 62a have a circular shape, the intermediate jet orifices 60b and the intermediate drain orifices 62b have a slightly elongated circular shape in the X-direction, and the intermediate jet orifices 60c and the intermediate drain orifices 62c have a more elongated circular shape in the X-direction. The intermediate jet orifices 60a are spaced apart from the intermediate drain orifices 62a by a long distance L1. The intermediate jet orifices 60b are spaced apart from the intermediate drain orifices 62b by a distance L2 shorter than the distance L1. The intermediate jet orifices 60c are spaced apart from the intermediate drain orifice 62c by a distance L3 shorter than the distance L2. Although not illustrated in any transparent plan view, the relation between the distances L1 to L3 described above is apparent from FIG. 19.

This multilayer structure can remove heat from the heat-receiving plate 18 not only at the top layer but at the deeper layers due to the heat transfer from the top layer to the deeper layers, and provides a larger effective cooling area than that of a single-channel structure, thereby increasing cooling capacity. The length of the cooling micropaths 28 in the respective three layers corresponds to the distances L1, L2, and L3 from the top layer in this order, that is, the length varies in accordance with the depth from the heat-receiving plate 18. This structure enables suitable cooling for each layer and can optimize the overall heat transfer. To reduce the variations of plates, the intermediate plates 58a, 58b, and 58c may have the same shape. The term diameter described in this specification is interpreted as a broader sense of a measurement relating to area, and is not limited to the measurement of a circle.

The present invention is not limited to the embodiment above, and various modifications may be made within the scope of the present invention.

REFERENCE SIGNS LIST

10 Heat sink
14a Fluid inlet
14b Fluid outlet
16 Heat-generating element (object)
18 Heat-receiving plate
18a Top surface
20, 20a, 20b, 20c Channel plate
22, 22a, 22b Orifice plate
24 Header plate
26 Bottom plate
28, 28a, 28b, 28c, 28d Cooling micropath
30, 30a, 30b, 30c Jet orifice
32, 32a, 32b, 32c Drain orifice
34 Peripheral wall
36 Baffle
38 Parallel plate
40 First end plate
42 Second end plate
44a Entrance channel
44b Supply sub-channel
44 Supply channel
46a Exit channel
46b Drain sub-channel
46 Drain channel
47 Thermally insulating slit (Insulator)
48 Narrow portion
50, 52, 54 Half-etch plate
51a, 51b Bent portion
53a Upstream cooling path
53b Downstream cooling path
53c Junction
56 Through-hole
58a, 58b, 58c Intermediate plate
60a, 60b, 60c Intermediate jet orifice
62a, 62b, 62c Intermediate drain orifice

The invention claimed is:

1. A multilayer heat sink that cools an object in contact with the heat sink by flowing a fluid from a fluid inlet to a fluid outlet, the heat sink comprising:
a heat-receiving layer having a top surface in contact with the object to receive heat;
a channel layer provided on a bottom surface of the heat-receiving layer, the channel layer including cooling micropaths extending and directing the fluid in a direction orthogonal to a stacking direction;
an orifice layer provided on a bottom surface of the channel layer, the orifice layer including:
jet orifices configured to jet the fluid into the cooling micropaths from a header layer; and
drain orifices configured to drain the fluid from the cooling micropaths toward the header layer;
the header layer provided on a bottom surface of the orifice layer, the header layer including:
a peripheral wall; and
a baffle provided in a region surrounded by the peripheral wall, the baffle being configured to separate the fluid inlet from the fluid outlet; and
a bottom layer provided on a bottom surface of the header layer, wherein
the baffle includes:
parallel plates disposed parallel to each other; and
end plates configured to alternately close an opening at an end and an opening at an opposite end of the parallel plates,
the orifice layer, the bottom layer, the baffle, and the peripheral wall define a supply channel to guide the fluid from the fluid inlet to the jet orifices and a drain channel to guide the fluid from the drain orifices to the fluid outlet,
the supply channel includes supply sub-channels flanked by the parallel plates, and an entrance channel connecting the fluid inlet with openings of the supply sub-channels,
the drain channel includes drain sub-channels flanked by the parallel plates, and an exit channel connecting the fluid outlet with openings of the drain sub-channels,
the entrance channel and the exit channel are provided at opposite positions,
the jet orifices are provided at positions overlapping the supply sub-channels when seen in the stacking direction, and are arranged in two lines for each supply sub-channel in an extension direction of the supply sub-channel,
the drain orifices are provided at positions overlapping the drain sub-channels when seen in the stacking direction, and are arranged in two lines for each drain sub-channel in an extension direction of the drain sub-channel, and
the cooling micropaths are configured to overlap the supply sub-channels and the drain sub-channels over the parallel plates when seen in the stacking direction to connect the jet orifices with the drain orifices.

2. The heat sink according to claim 1, wherein each of the cooling micropaths is configured to connect neighboring one jet orifice with one drain orifice.

3. The heat sink according to claim 1, wherein the cooling micropaths have a non-linear shape having one or more bent portions when seen in the stacking direction.

4. The heat sink according to claim 1, wherein the cooling micropaths include:
upstream cooling paths configured to connect with the jet orifices,
downstream cooling paths configured to connect with the drain orifices, and
junctions at which each of the upstream cooling bifurcates into two branches and at which the adjacent branches join together to connect with the respective downstream cooling paths.

5. The heat sink according to claim 1, wherein the cooling micropaths have a different shape and/or length depending on locations.

6. The heat sink according to claim 5, wherein the cooling micropaths include a narrow portion having a smaller width depending on the locations.

7. A multilayer heat sink that cools an object in contact with the heat sink by flowing a fluid from a fluid inlet to a fluid outlet, the heat sink comprising:
a heat-receiving layer having a top surface in contact with the object to receive heat;
a channel layer provided on a bottom surface of the heat-receiving layer, the channel layer including cooling micropaths extending and directing the fluid in a direction orthogonal to a stacking direction;

an orifice layer provided on a bottom surface of the channel layer, the orifice layer including
jet orifices configured to jet the fluid into the cooling micropaths from a header layer; and
drain orifices configured to drain the fluid from the cooling micropaths toward the header layer;
the header layer provided on a bottom surface of the orifice layer, the header layer including
a peripheral wall; and
a baffle provided in a region surrounded by the peripheral wall, the baffle being configured to separate the fluid inlet from the fluid outlet; and
a bottom layer provided on a bottom surface of the header layer, wherein
the baffle includes
parallel plates disposed parallel to each other; and
end plates configured to alternately close an opening at an end and an opening at an opposite end of the parallel plates,
the orifice layer, the bottom layer, the baffle, and the peripheral wall define a supply channel to guide the fluid from the fluid inlet to the jet orifices and a drain channel to guide the fluid from the drain orifices to the fluid outlet, and
the parallel plates and the end plates at least partially have a multilayer structure with an insulator interposed in a thickness direction.

8. The heat sink according to claim 1, wherein the heat-receiving layer, the channel layer, the orifice layer, the header layer, and the bottom layer are made of plate members bonded by diffusion bonding.

9. The heat sink according to claim 8, wherein the cooling micropaths are through-holes provided in a plate member that forms the channel layer.

10. The heat sink according to claim 8, wherein the jet orifices and the drain orifices are through-holes provided in a plate member that forms the orifice layer.

11. The multilayer heat sink of claim 1, wherein
either one or both of the jet orifices and the drain orifices have a different diameter depending on locations of the orifices on the orifice layer.

12. The heat sink according to claim 11, wherein the orifice layer is made of a plurality of plate members bonded by diffusion bonding, and either one or both of the jet orifices and the drain orifices have a different diameter depending on locations of the orifices on the plate members.

13. The heat sink according to claim 1, wherein
the channel layer includes a plurality of channel layers between which an intermediate layer is interposed, and
the intermediate layer includes:
intermediate jet orifices disposed at positions overlapping the jet orifices when seen in the stacking direction; and
intermediate drain orifices disposed at positions overlapping the drain orifices when seen in the stacking direction.

14. The heat sink according to claim 13, wherein the intermediate jet orifices and the intermediate drain orifices connect the cooling micropaths at a top layer with the cooling micropaths at a bottom layer.

15. The heat sink of claim 1, wherein each of the supply sub-channels is provided between two drain sub-channels.

16. The heat sink of claim 1, wherein the drain channel further includes two outermost drain sub-channels, each flanked by the peripheral wall and a corresponding parallel plate of the parallel plates, and
the drain orifices include corresponding single lines of orifices, provided at positions overlapping a corresponding one of the outermost drain sub-channels when seen in the stacking direction, and arranged in an extension direction of the outermost drain sub-channels.

17. The heat sink of claim 1, wherein each of the cooling micropaths connects only one jet orifice with only one drain orifice.

* * * * *